(12) United States Patent
Kim

(10) Patent No.: US 7,031,200 B2
(45) Date of Patent: Apr. 18, 2006

(54) DATA OUTPUT APPARATUS FOR MEMORY DEVICE

(75) Inventor: Dong Kyun Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/878,712

(22) Filed: Jun. 28, 2004

(65) Prior Publication Data

US 2005/0237819 A1 Oct. 27, 2005

(30) Foreign Application Priority Data

Apr. 22, 2004 (KR) .................. 10-2004-0027899

(51) Int. Cl.
*G11C 7/10* (2006.01)
(52) U.S. Cl. .................. 365/189.05; 365/189.01; 365/189.11
(58) Field of Classification Search .............. None
See application file for complete search history.

(56) References Cited

U.S. PATENT DOCUMENTS 6,741,521 B1 * 5/2004 Kono ................. 365/233
2004/0189352 A1 * 9/2004 Jeon ................. 327/112

* cited by examiner

*Primary Examiner*—Amir Zarabian
*Assistant Examiner*—Kretelia Graham
(74) *Attorney, Agent, or Firm*—Ladas & Parry LLP

(57) ABSTRACT

A data output circuit for a memory device improves data transfer speed from the memory device by re-amplifying stored data using by a bitline sense amplifier and transferring it to global input/output lines. Data read from the memory device is coupled to an amplifier interposed between the first and second "local" data lines. CMOS buffers receive data on first and second local data lines and outputs the data to first and second latches, the outputs of which are coupled to the inputs of a series connected pull-up transistor and a pull-down transistor coupled between a driving voltage and a ground terminal in series.

7 Claims, 2 Drawing Sheets

DATA OUTPUT APPARATUS FOR MEMORY DEVICE

BACKGROUND OF THE INVENTION

1. Field of the Invention

The present invention relates to a data output apparatus in a memory device, and more particularly to, a data output apparatus improved a data transferring speed by re-amplifying a data amplified by a bitline sense amplifier and transferring it to global input/output lines

2. Description of the Related Art

In general, during a read operation of a memory device, a cell data selected by an address signal is transferred to a local data line after being sensed and amplified by a bitline sense amplifier. Typically, a bitline and a local data line are comprised of a pair, respectively.

However, it is merely about 20 mV for the differences between high level and low level of the data transferred to the local data lines. As a result, it is necessary to perform processes for converting the data to a CMOS voltage level. Those processes are performed by an amplifier(with reference to an amplifier in FIG. 1) disposed between a pair of local data lines. That is, the data of high and low levels transferred to the local data lines are amplified to a driving voltage VDD level and a ground voltage level. Accordingly, the voltage difference between the high and low levels is a VDD. Here, the VDD could be 1.8V, or 2.5V according to kinds of memory devices as a driving voltage applied to the memory device.

Hereinafter, it will be described about a conventional data output apparatus in more detail with reference to FIG.

Referring to FIG. 1, a Main Amplifier Data True MADT is disposed on a local data line receiving data transferred through a bitline BIT, and a Main Amplifier Data Bar MADB is disposed on a local data line receiving data transferred through a bitline /BIT.

An amplifier in FIG. 1 is a circuit for amplifying the data MADT and MADB transferred from the bitlines to a CMOS voltage level. The operation of the amplifier is controlled by a Main Amplifier Enable signal MAE. That is, the amplifier is normally operated while the MAE signal maintains high level.

As described in FIG. 1, transistors P1, N1 and N2 are CMOS type buffer receiving the data MADT and latch INV1, INV2 hold an output signal of the CMOS buffer.

Data MAQ outputted from the latch INV1, INV2 is applied to inverters INV3, INV4, respectively.

An output signal of the inverter INV3 is transferred to a gate of a pull-up transistor P3 through a switch TM1, while an output signal of the inverter INV4 is transferred to a gate of a pull-down transistor N3 through a switch TM2.

The switches TM1, TM2 are controlled by a control signal MAOEB. As shown in FIG. 1, when the control signal MAOEB is low level, the switches TM1, TM2 are turned on to transfer outputs from the inverters INV3, INV4 to the gates of the pull-up transistor P3 and the pull-down transistor N3, respectively. On the other hand, when the control signal MAOEB is high level, the switches TM1, TM2 are turned off. The circuit in FIG. 1 is precharged in case that the control signal MAOEB is high level, while the circuit is normally operated in case that the control signal MAOEB is low level.

When the pull-down transistor N3 is operated, a transistor P2 positioned between a driving voltage VDD and a gate of the pull-up transistor P3 disables the operation of the pull-up transistor P3. As similar to this, when the pull-up transistor P3 is operated, a transistor N4 positioned between a gate of the pull-down transistor N3 and a ground voltage terminal disables the operation of the pull-down transistor N3.

For instance, when the control signal MAOEB is high level which means to be precharged, the transistor P2 disposed between the power source voltage and the pull-up transistor P3, and the transistor N4 disposed between the gate of the pull-down transistor N3 and the ground voltage terminal turn off the transistors P3, P2 according to applying the gate node for the transistor P3 to high level and the gate node for the transistor N3 to low level, respectively. On the other hand, the transistors P2 and N4 maintain to be turned off when the control signal MAOEB is low level.

A global data line gio bus transfers the data generated from the pull-up transistor P2 and the pull-down transistor N4 to a data output driver(not shown in FIG. 1).

Hereinafter, it will be described of an operation of the circuit shown in FIG. 1, with reference to FIG. 2.

Before the control signal MAE which adjusts the operation of the amplifier is enabled to high level, the voltage difference between the data MADT and MADB transferred from the bitlines to the local data lines is very small, as described in FIG. 2. The data MADT is denoted with a dotted line and the data MADB is denoted with a solid line in FIG. 2.

The amplifier is operated when the control signal MAE is transited to high level. Accordingly, the data MADT on the local data line rises to a driving voltage level and the data MADB falls down to a ground voltage level, which means to be developed to the CMOS voltage level.

Further, the output signal MAQB of the CMOS buffer is low level as the data MADT is high level, which results in that the data MAQ outputted from the latch INV1, INV2 is high level.

The inverters INV3, INV4 receive the data MAQ and then invert the data MAQ.

After the whole operations have been done, when the control signal MAOEB is transited to low level, the switches TM1 and TM2 are turned on thereby. Thus, the output signals of the inverters INV3 and INV4 are transferred to the gates for the pull-up transistor P3 and the pull-down transistor N3.

Furthermore, since the data MAQ is high level, the pull-up transistor P3 will be turned on. Accordingly, the data MAQ of high level transfers to the global data line gio bus.

Still referring to FIG. 2, when both data MADT and MADB are high level, the local data lines are precharged. Then, after being precharged, the step that a potential of the data MADT with a dotted line, becomes lower than that of the data MADB illustrates a procedure of transferring data from the bitlines.

A delay time in FIG. 2 is a time from the control signal MAE being enabled to data being outputted to a global data line. Moreover, a Margin is a time from the control signal MAE being enabled to the control signal MAOEB being enabled to low level. Therefore, these delay time and margin are intimately associated with a data transferring speed of a data output apparatus .

However, the conventional apparatus has many delay elements (the inverters INV3, INV4 and the switches TM1 and TM2), so it is difficult to reduce the delay time. Thus, it is not available to use the conventional apparatus for the next generation memory device which operates speedy such as DDR2 SDRAM.

SUMMARY OF THE INVENTION

Accordingly, the present invention has been made in an effort to solve the problems occurring in the related art, and an object of the present invention is to provide a high speed data output apparatus applicable to a next generation memory device.

Another object of the present invention is to provide a data output apparatus capable of reducing a read operation time of a memory device by improving a speed of data transferring through reducing delay elements of data transferring.

In order to achieve the above object, according to one aspect of the present invention, there is provided a data output apparatus for a memory device, comprising: first and second local data lines for receiving data transferred from a pair of bitlines of a memory device; an amplifier interposed between the first and second local data lines; a first CMOS buffer means for receiving data on the first local data line; a second CMOS buffer means for receiving data on the second local data line; a first latch means for holding an output signal of the first CMOS buffer means; a second latch means for holding an output signal of the second CMOS buffer means; and the pull-up transistor and the pull-down transistor coupled between a driving voltage and a ground terminal in series. Here, an output signal of the first latch means is applied to a gate of the pull-up transistor, while an output signal of the second latch means is applied to the pull-down transistor.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
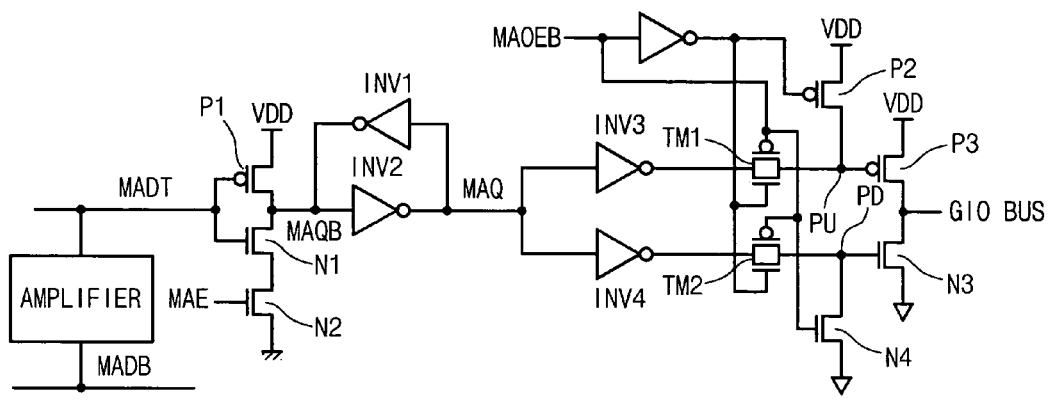
FIG. 1 is a circuit diagram illustrating a conventional data output apparatus.
Figure 2:
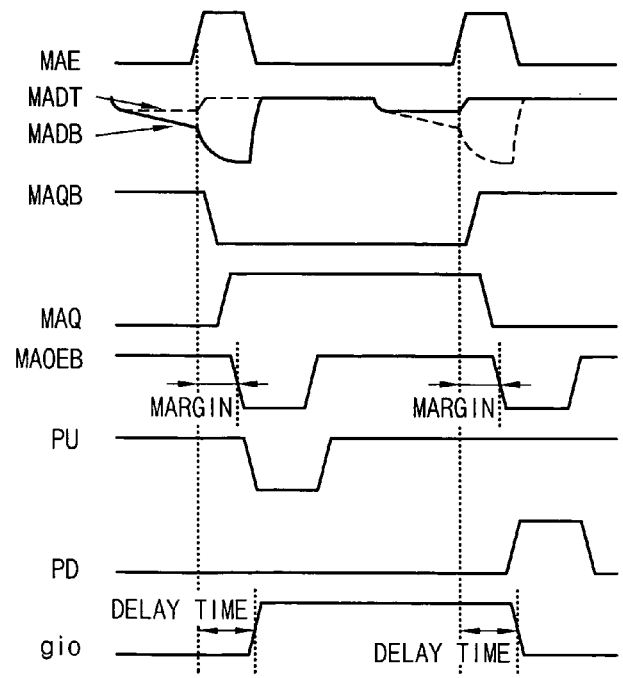
FIG. 2 is a waveform diagram illustrating an operation of the data output apparatus shown in FIG. 1.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
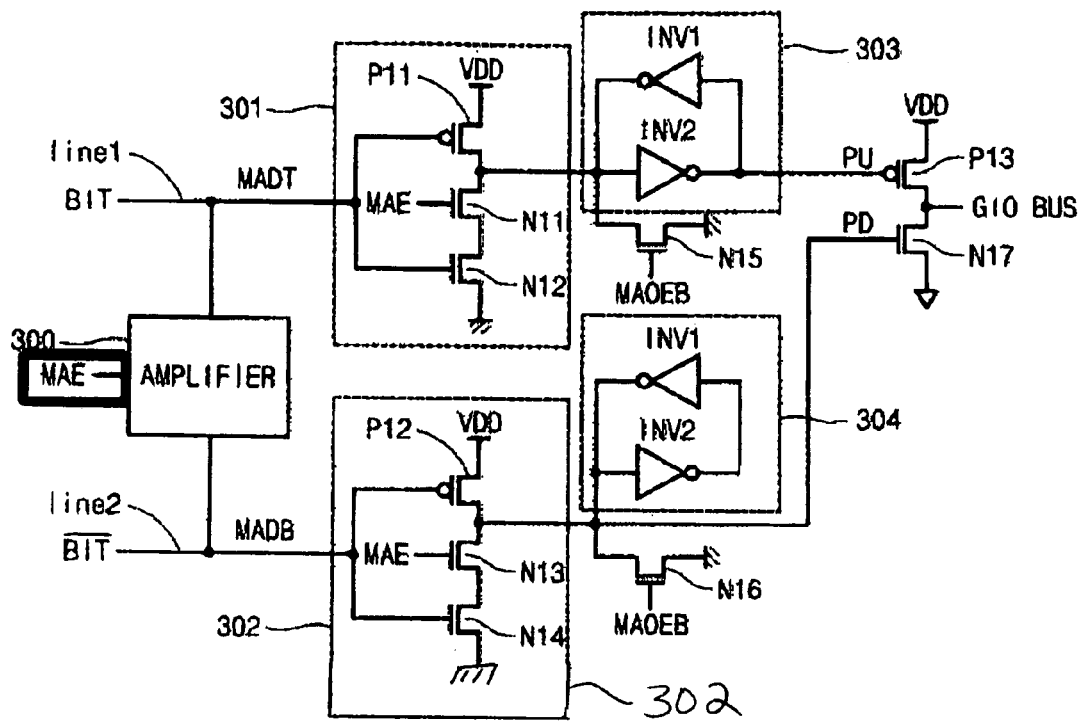
FIG. 3 is a circuit diagram illustrating an exemplary embodiment of a data output apparatus in accordance with the present invention.

FIG. 3 is a circuit diagram illustrating an exemplary embodiment a data output apparatus for a memory device in accordance with the present invention.

The data output apparatus for the memory device is comprised of local data lines line1, line2, an amplifier 300, CMOS buffers 301, 302, latches 303, 304, and the pull-up transistor P13 and the pull-down transistor N17.

The local data lines line1, line2 receive data transferred from a pair of bitlines BIT, /BIT of the memory device. As shown in FIG. 3, a MADT is a data on the local data line line1, a MADB is another data on the local data line line2.

As described above, it's merely about 200 mV, as aforementioned, for a voltage difference of data MADT, MADB transferred to the local data lines from the bitlines. Thus, it is necessary for the voltage difference to be amplified to a CMOS voltage level.

The amplifier 300 functions to amplify the data MADT and MADB on the local data lines to the CMOS voltage level. As can be seen from FIG. 4, when a control signal MAE is transited to high level and the amplifier 300 is operated thereto, the high level data MADT on a local line which is denoted with a dotted line is rising to a driving voltage VDD level and the low level data MADB on a local line which is denoted with a solid line is falling down to a ground level.

Meanwhile, the CMOS buffer 301 is comprised of a PMOS transistor P11 and NMOS transistors N11, N12 coupled between the driving voltage VDD and a ground terminal in series. A common gate of the PMOS transistor P11 and the NMOS transistors N11, N12 is coupled to the local data line line1. The control signal MAE is applied to the gate of the NMOS transistor N11. The control signal MAE adjusts operations of the amplifier 300 and the CMOS buffer 301. When the control signal MAE is transited to high level, the amplifier 300 and the CMOS buffer 301 carry out a normal operation. That is, the CMOS buffer 301 receives the data MADT amplified by the amplifier 300 and then outputs the data MADT after reversing its logical level. Here, a NMOS transistor N15 is positioned between an output terminal of the CMOS buffer 301 and a ground terminal, and a gate of the NMOS transistor N15 is applied a control signal MAOEB.

The CMOS buffer 302 is comprised of a PMOS transistor P12 and NMOS transistors N13, N14. A common gate of the PMOS transistor P12 and the NMOS transistor N14 is coupled to the local data line line2, while a gate of the NMOS transistor N13 is applied the control signal MAE. When the control signal MAE is transited to high level, the CMOS buffer 302 carries out a normal operation. That is, the CMOS buffer 302 receives the data MADB amplified by the amplifier 300 and then outputs the data MADB after inverting its logical level. Here, a NMOS transistor N16 is positioned between an output terminal of the CMOS buffer 302 and the ground terminal, and a gate of the NMOS transistor N16 is applied the control signal MAOEB.

The latch 303 is composed of two inverters INV1, INV2 and holds an inverted output signal of the CMOS buffer 301. On the other hand, the latch 304 is composed of two inverters INV3, INV4 and holds its own logical level of an output signal of the CMOS buffer 302.

An output terminal of the latch 303 is coupled to a gate PU of the pull-up transistor P13, while an output terminal of the latch 304 is coupled to a gate PD of the pull-down transistor N17.

The pull-up transistor P13 and the pull-down transistor N17 are coupled in series between the driving voltage VDD and the ground terminal.

Figure 4:
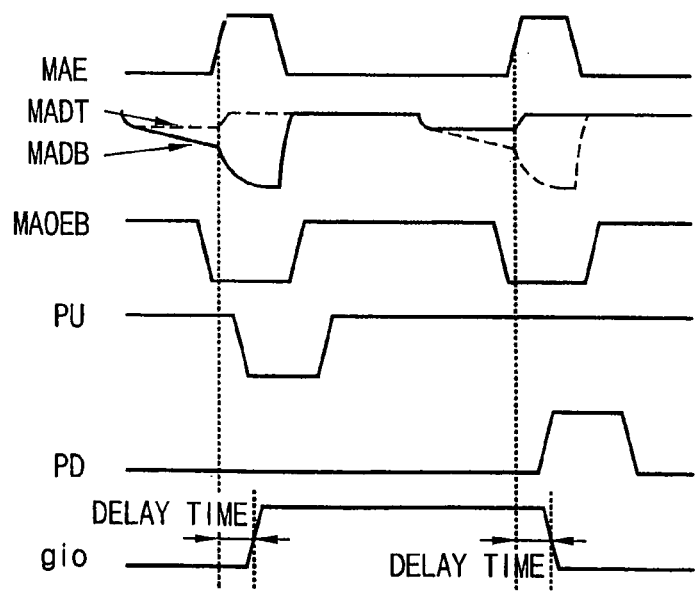
FIG. 4 is a waveform diagram illustrating an operation of the data output apparatus shown in FIG. 3.

FIG. 4 is a waveform diagram illustrating an operation of the data output apparatus in accordance with the present invention, as shown in FIG. 3.

Referring to FIG. 4, the control signal MAE controls operations of the amplifier 300 and CMOS buffers 301, 302. Thus, the amplifier 300 and CMOS buffers 301, 302 carry out normal operations while the control signal MAE maintains high level.

The data MADT on the local data line line1 is denoted with a dotted line, while the data MADB on the local data line line2 is denoted with a solid line. As described in FIG.

4, when the amplifier 300 carries out the normal operation by means of transiting the control signal MAE to high level, the data MADT and MADB are amplified to the driving voltage VDD and the ground voltage, respectively. Meanwhile, when the control signal MAE is transited to low level, the local data lines line1, line2 are transited to a precharged state. All the data MADT and MADB on the local data lines, as referred to FIG. 4, maintain the driving voltage VDD level in the precharged state.

After being precharged, when applying a signal of low level through the bitline BIT and a signal of high level through the bitline /BIT, the data MADT denoted with a dotted line breaks away from the precharged state so as to make the voltage down and the data MADB denoted with a solid line maintains a constant voltage. And then, when the control signal MAE is transited to high level, the data MADT and MADB, as aforementioned, are amplified to the CMOS voltage level by the amplifier 300.

As the control signal MAOEB is applied to gates of the NMOS transistors N15, N16, it maintains high level while the data output apparatus is in the precharged state. When the control signal MAOEB is high level, a potential level of the output terminal of CMOS buffers 301, 302 becomes ground state by means of the NMOS transistors N15, N16 which are all turned on. Therefore, the pull-up transistor P13 and the pull-down transistor N17 are turned off. While this, a global data line gio bus latches the data predetermined in the previous cycle or is precharged to a predetermined voltage level.

Hereinafter, it will be described about operations of the data output apparatus in accordance with the present invention, with reference to FIGS. 3 and 4.

Potential levels of the local data lines line1, line2 maintain high level in the precharged state.

The potential difference between the local data lines is rising to about 200 mV, as shown in FIG. 4, in response to applying a data signal from the bitlines to the local data lines.

Next, the control signal MAOEB which has maintained high level in the precharged state is transited to low level.

After the control signal MAOEB is transited to low level, the control signal MAE which controls operations of the amplifier 300 and CMOS buffers 301, 302 is enabled to high level.

Accordingly, the data MADT and MADB on the local data lines, as depicted in FIG. 4, are amplified to the CMOS voltage level. While this, each logical level of the data MADT and MADB is opposite.

The amplified data MADT is applied to the gate PU of the pull-up transistor P13 passing through the CMOS buffer 301 and the latch 303.

Otherwise, the amplified data MADB is applied to the gate PD of the pull-down transistor N17 passing through the CMOS buffer 302 and the latch 304.

The data of high level or low level is transferred to the global data line gio bus in response of the pull-up transistor N13 or the pull-down transistor N17 which is turned on.

Additionally, it will now be explained excellent characteristics of circuit diagrams of the data output apparatus in accordance with the present invention, as comparing with the conventional art.

First of all, the circuit of the conventional art uses the pull-up transistor and the pull-down transistor only available with one local data line with reference to FIG. 1. On the other hand, the circuit of the present invention is provided the CMOS buffers and the latches corresponding to each of the local data lines line1 and line2 with reference to FIG. 3.

Further, there are inverters INV3, INV4 and switches TM1, TM2 positioned between the latches and the pull-up transistor and the pull-down transistor in the conventional circuit, while the latches and the pull-up transistor and the pull-down transistor are directly coupled to each other in the present invention.

Those differences are advantageous to reduce the data transferring time in the circuit of the present invention. That is, because the amplified data passed through the CMOS buffers and the latches and then it is directly applied to the pull-up transistor and the pull-down transistor, the data transferring time in the present invention is taken shorter than the time in the conventional circuit.

Those results are led by that the control signal MAOEB is transited to low level earlier than the control signal MAE is transited to high level, and that the data delay means needed during transferring data is partially removed.

As apparent from the above description, the present invention provides the data output apparatus for reducing the data transferring speed, of which circuits are applicable to the next generation memory device requiring a high speed operation.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A data output apparatus for a memory device, comprising:
    first and second local data lines for receiving data transferred from a pair of bitlines of;
    an amplifier interposed between the first and second local data lines;
    a first CMOS buffer means for receiving data on the first local data line;
    a second CMOS buffer means for receiving data on the second local data line;
    a first latch means for holding an output signal of the first CMOS buffer means;
    a second latch means for holding an output signal of the second CMOS buffer means; and
    a pull-up transistor and a pull-down transistor coupled in series between a driving voltage and a ground terminal;
    a first switch coupled between an input unit of the first latch means and a ground terminal;
    a second switch coupled between an input unit of the second latch means and the ground terminal;
    wherein, during a standby mode, the first and second switches are turned on thereby coupling the input units of the first and second latch means to the ground terminal and during an operating mode, the first and second switches are continually turned off;
    and wherein an output signal of the first latch means is applied to a gate of the pull-up transistor, while an output signal of the second latch means is applied to a gate of the pull-down transistor.

2. The data output apparatus of claim 1, wherein the amplifier and the first and second CMOS buffer means are enabled by a first control signal, and
    the enabled amplifier amplifies the data on the first and second local data lines, transferring them to the first and second CMOS buffer means.

3. The data output apparatus of claim 1, wherein during an operating mode, the first control signal is enabled after the first and second switches are turned off.

4. The data output apparatus of claim 1, wherein the first and second switches comprise MOS transistors and are turned on/off according to a second control signal applied to a gate of each MOS transistor.

5. The data output apparatus of claim 4, wherein the amplifier and the first and second CMOS buffer means are enabled by the first control signal, after the first and second switches are turned off by the second control signal.

6. The data output apparatus of claim 1, wherein the first CMOS buffer means receive the data on the first local data line, thereto inverting it; and the second CMOS buffer means receives the data on the second local data line, thereto inverting it.

7. The data output apparatus of claim 1, wherein during an operating mode, the data on the first local data line has an opposite logical level to the data on the second data line.

\* \* \* \* \*